United States Patent
Andreev et al.

(10) Patent No.: US 6,530,063 B1
(45) Date of Patent: Mar. 4, 2003

(54) METHOD AND APPARATUS FOR DETECTING EQUIVALENT AND ANTI-EQUIVALENT PINS

(75) Inventors: Alexander Andreev, San Jose, CA (US); Ranko Scepanovic, San Jose, CA (US); Anatoli Bolotov, Moscow (RU)

(73) Assignee: LSI Logic Corporation, Milpitas, CA (US)

(*) Notice: Subject to any disclaimer, the term of this patent is extended or adjusted under 35 U.S.C. 154(b) by 122 days.

(21) Appl. No.: 09/677,276

(22) Filed: Oct. 2, 2000

(51) Int. Cl.[7] .............................................. G06F 17/50
(52) U.S. Cl. ................................. 716/3; 716/2; 716/4
(58) Field of Search ................................. 716/2–8, 17

(56) References Cited

U.S. PATENT DOCUMENTS 5,883,811 A * 3/1999 Lam .............................. 716/6
6,345,379 B1 * 2/2002 Khouja et al. ............... 716/4

* cited by examiner

*Primary Examiner*—Vuthe Siek
*Assistant Examiner*—Naum Levin
(74) *Attorney, Agent, or Firm*—Mitchell, Silberberg & Knupp, LLP

(57) ABSTRACT

The present invention involves a method for determining constant pins in a combinational circuit. The method comprises the steps of associating an input of a combinational circuit with a first variable and a second variable, wherein said second variable is the compliment of said first variable, computing for a first logical cell interconnected to said input a first canonical representation, wherein said first canonical representation is a function of the operation of said first logical cell and a function of said first value, computing for said first logical cell a second canonical representation, wherein said second canonical representation is a function of the operation of said first logical cell and a function of said second value, determining whether one of said first and second canonical representations is equal to zero.

15 Claims, 12 Drawing Sheets

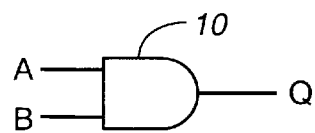
FIG._1A
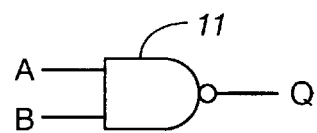
FIG._1B
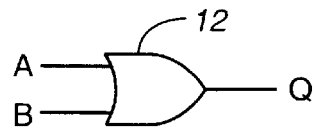
FIG._1C
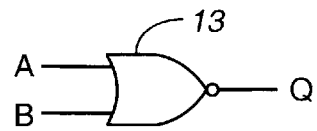
FIG._1D
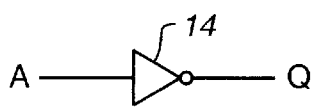
FIG._1E
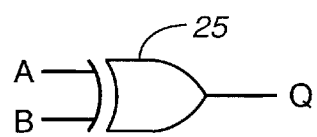
FIG._3A
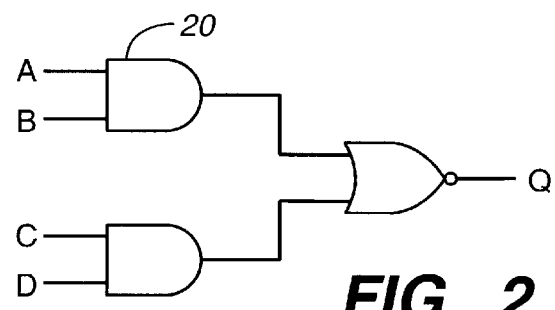
FIG._2
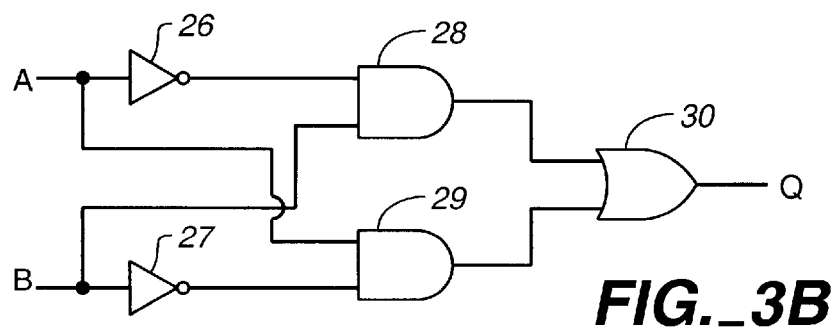
FIG._3B

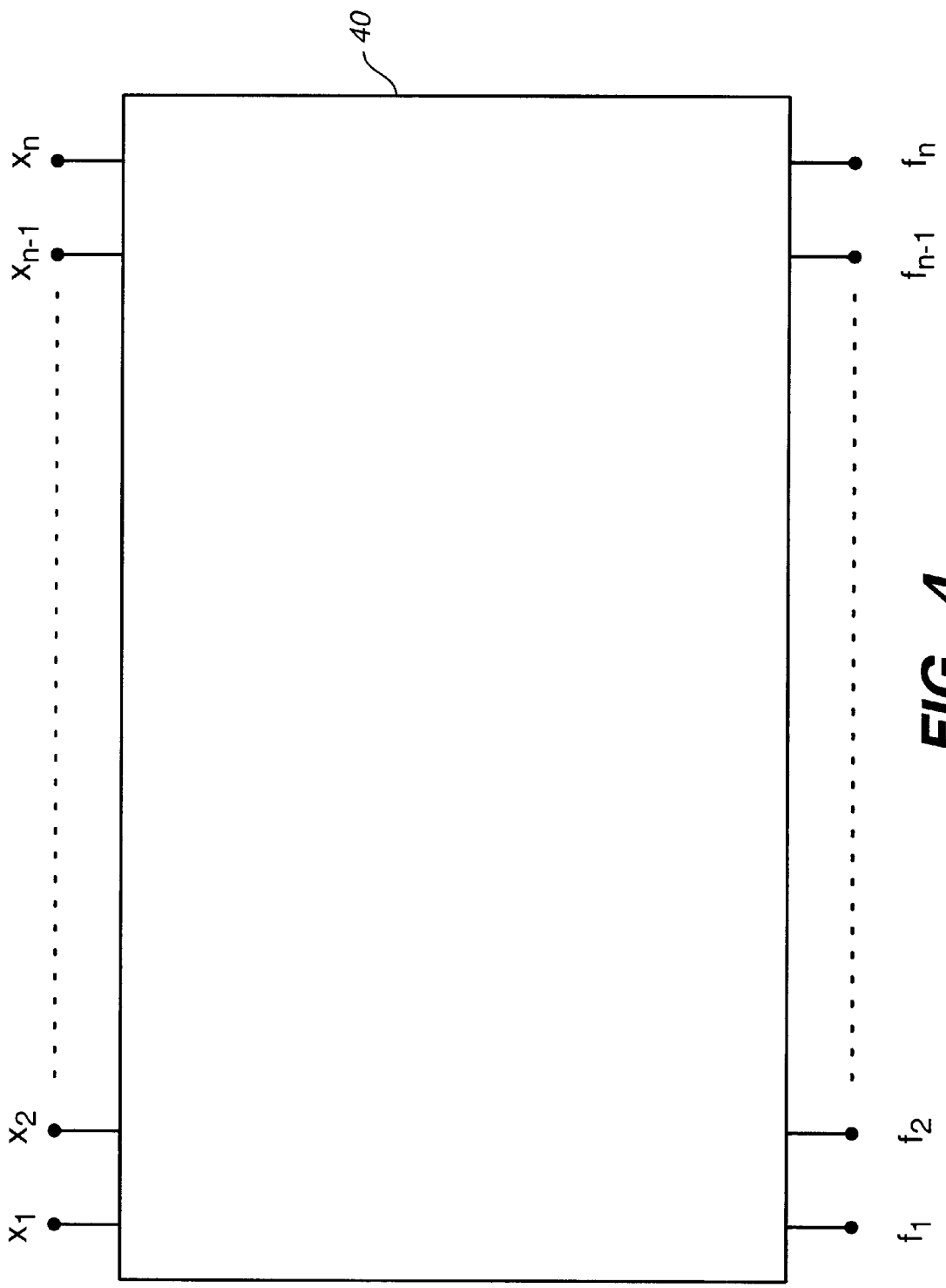
FIG._4

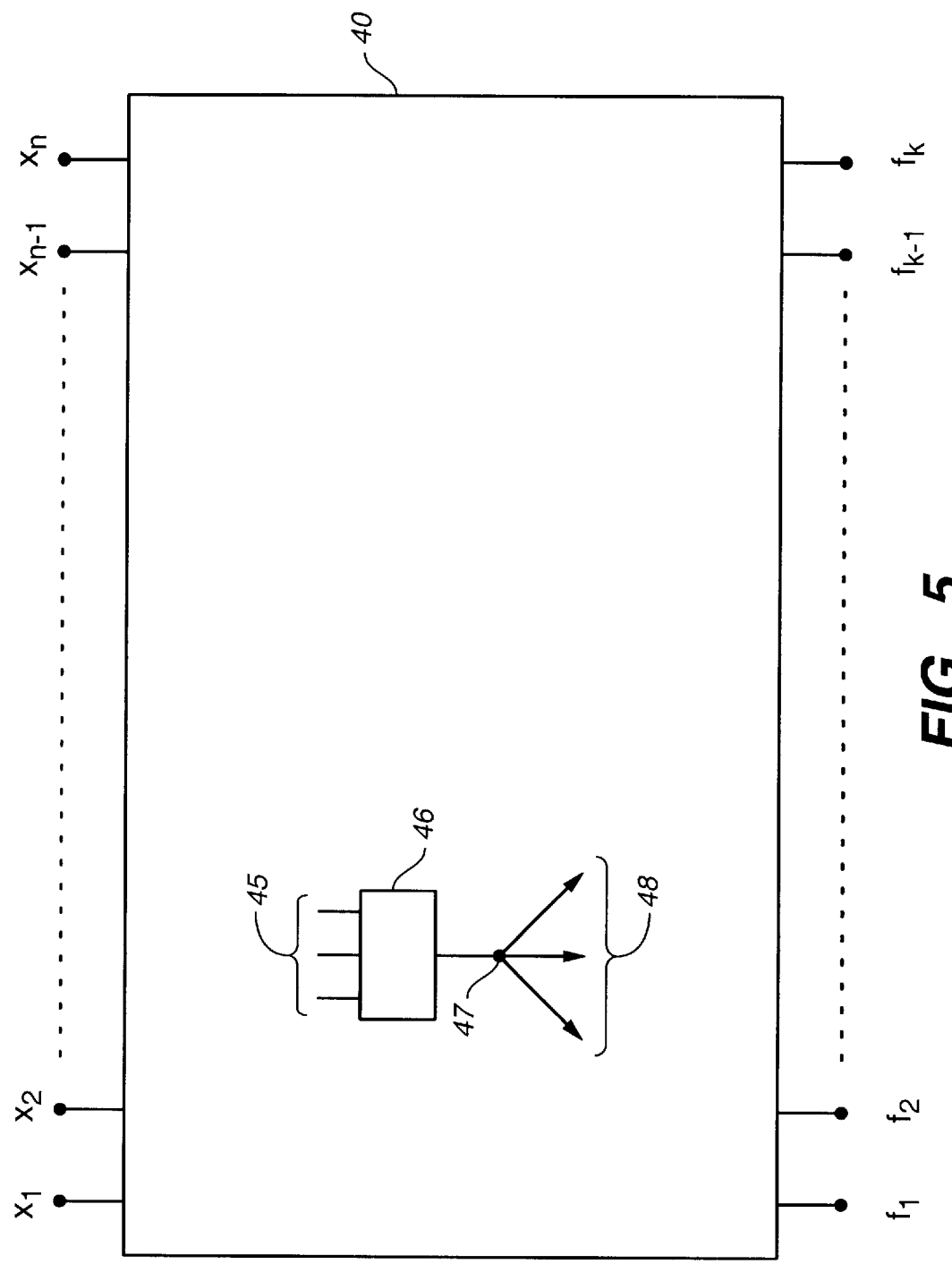
FIG._5

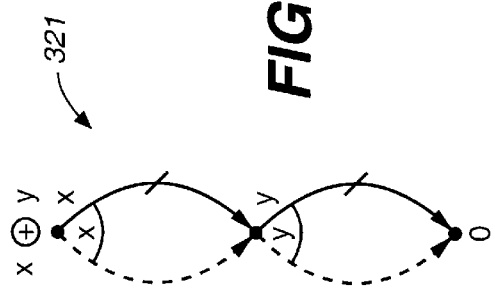
FIG._6A
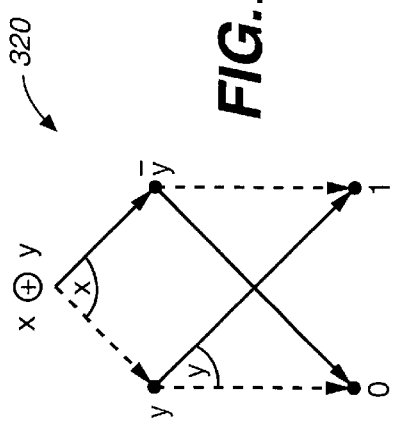
FIG._6B
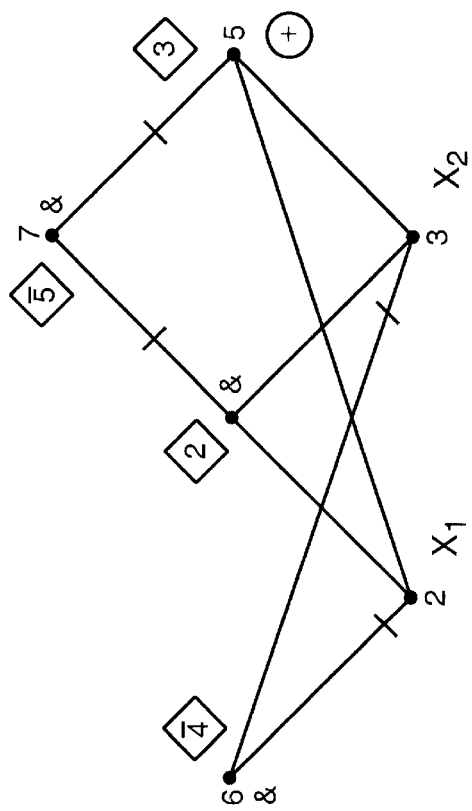
FIG._8
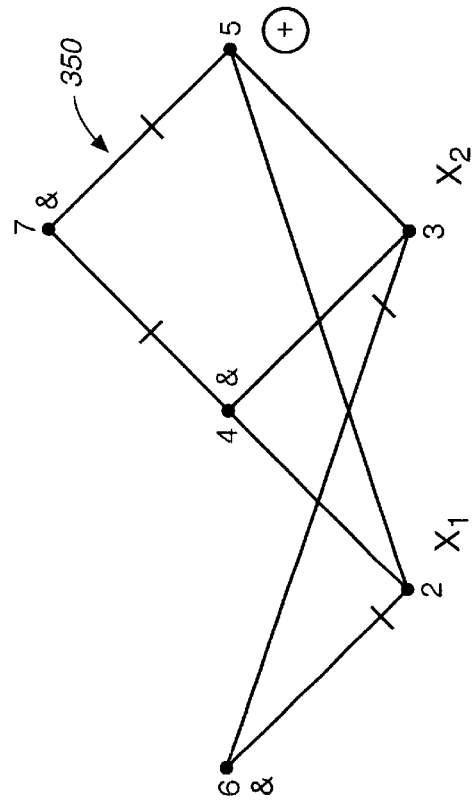
FIG._9

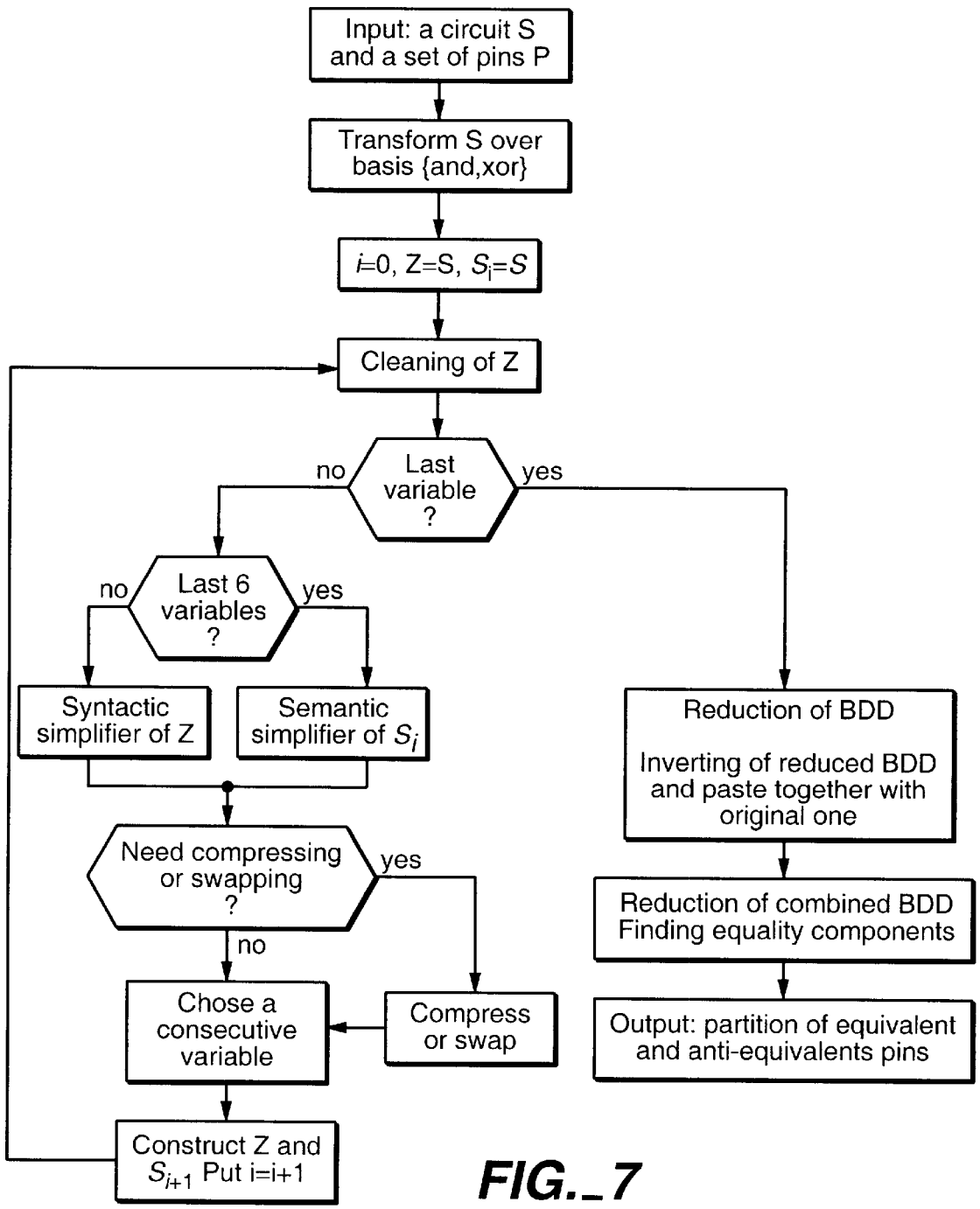
FIG._7

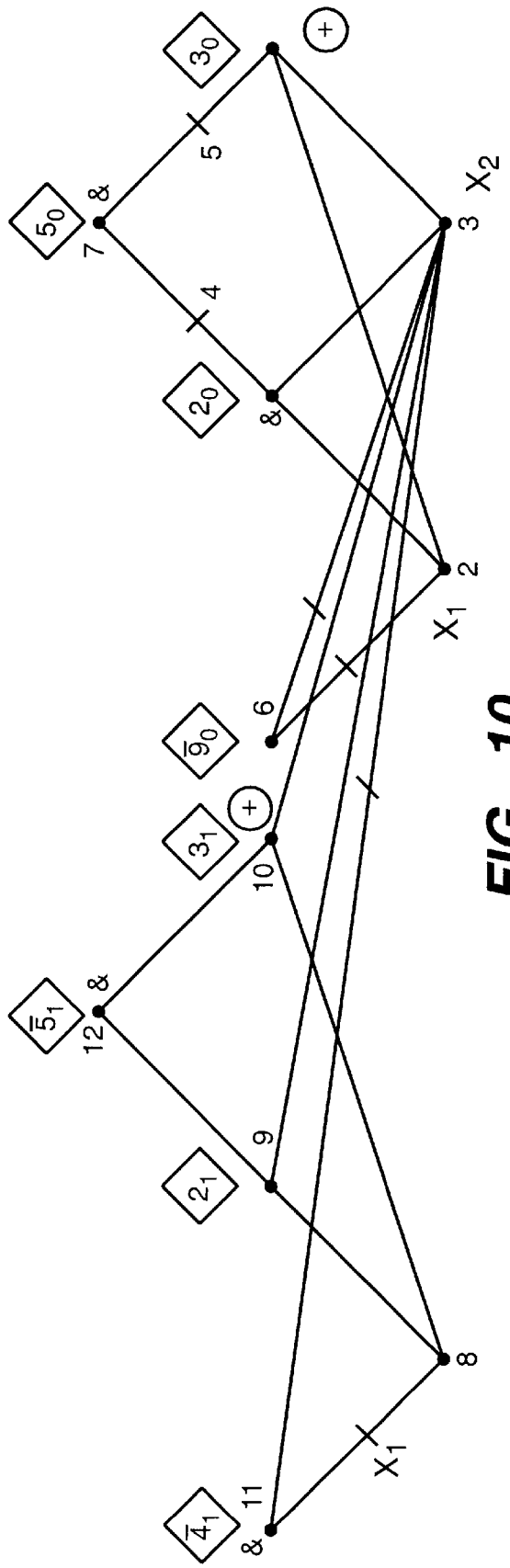
FIG._10

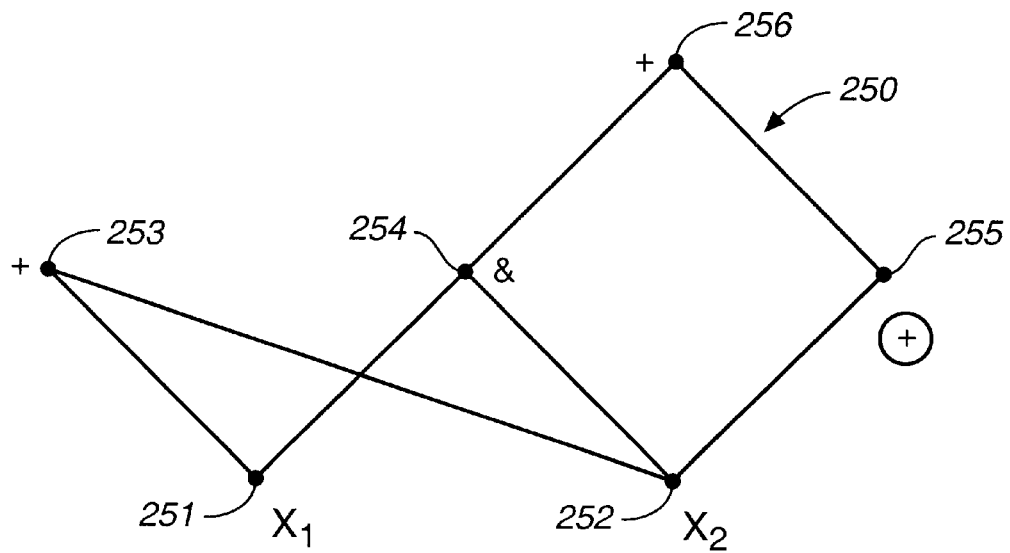
FIG._11A
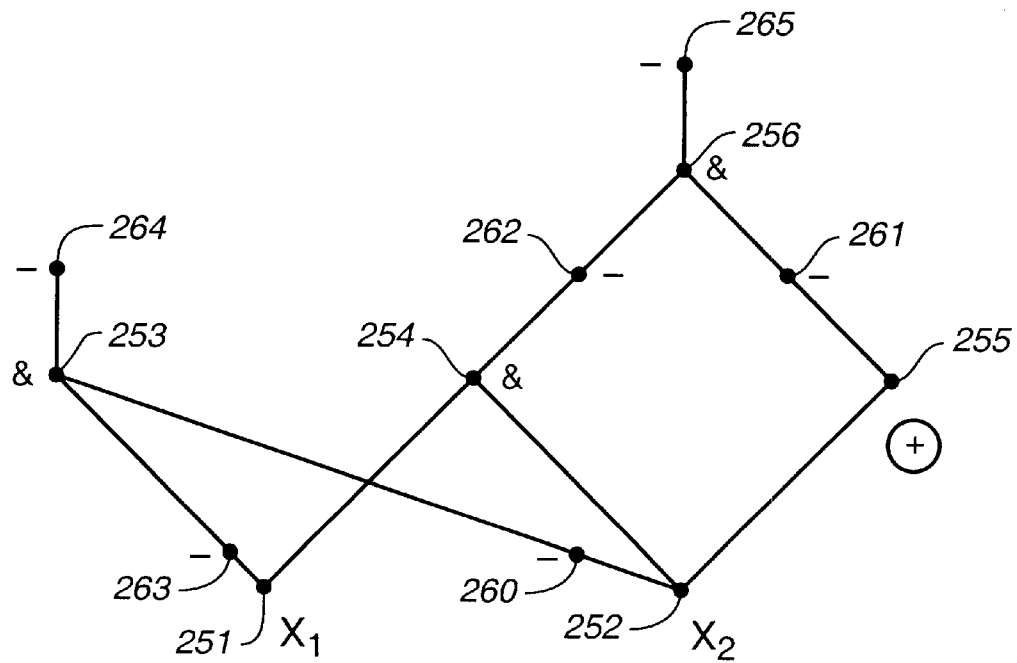
FIG._11B

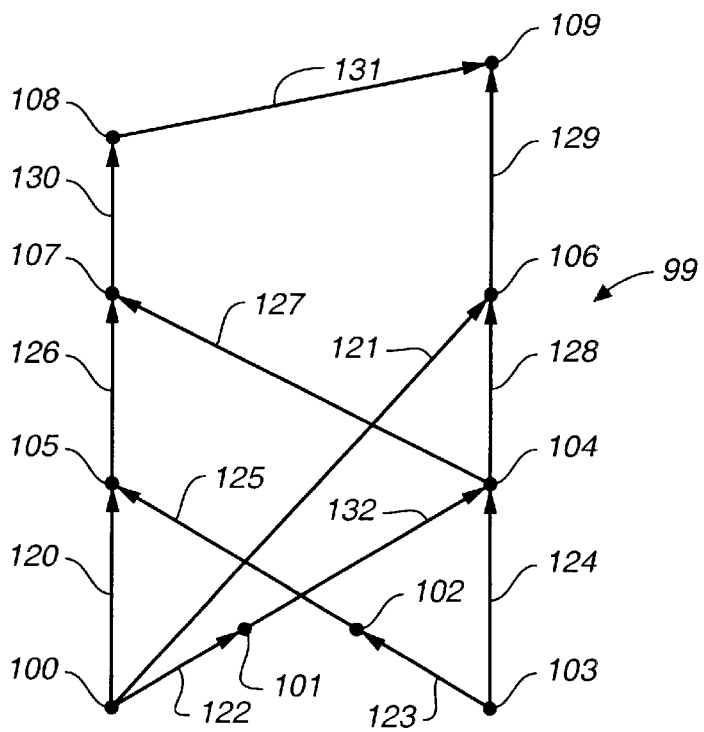
FIG._12A
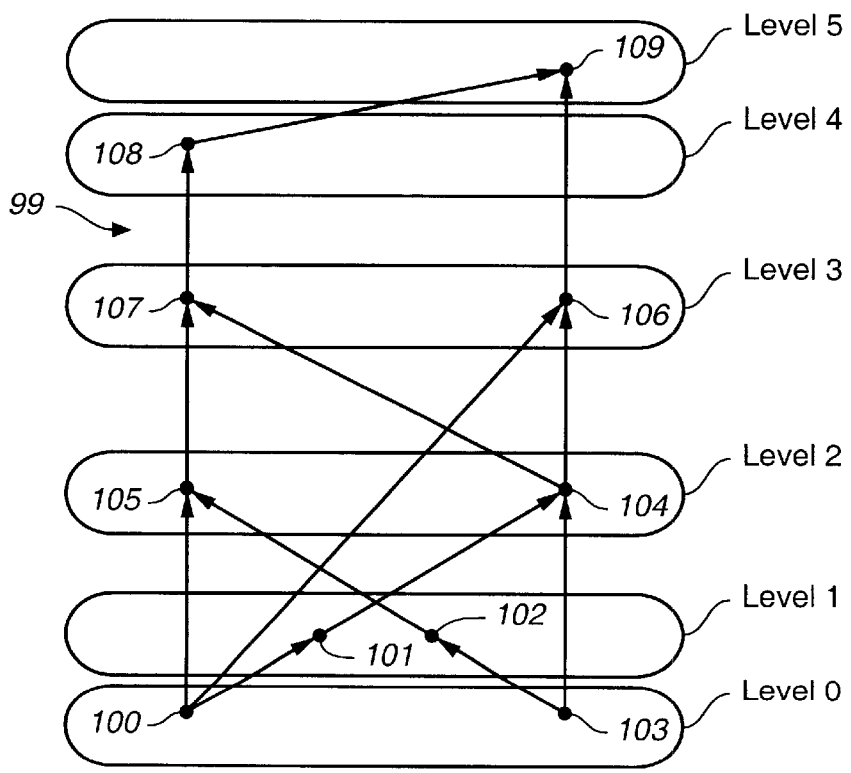
FIG._12B

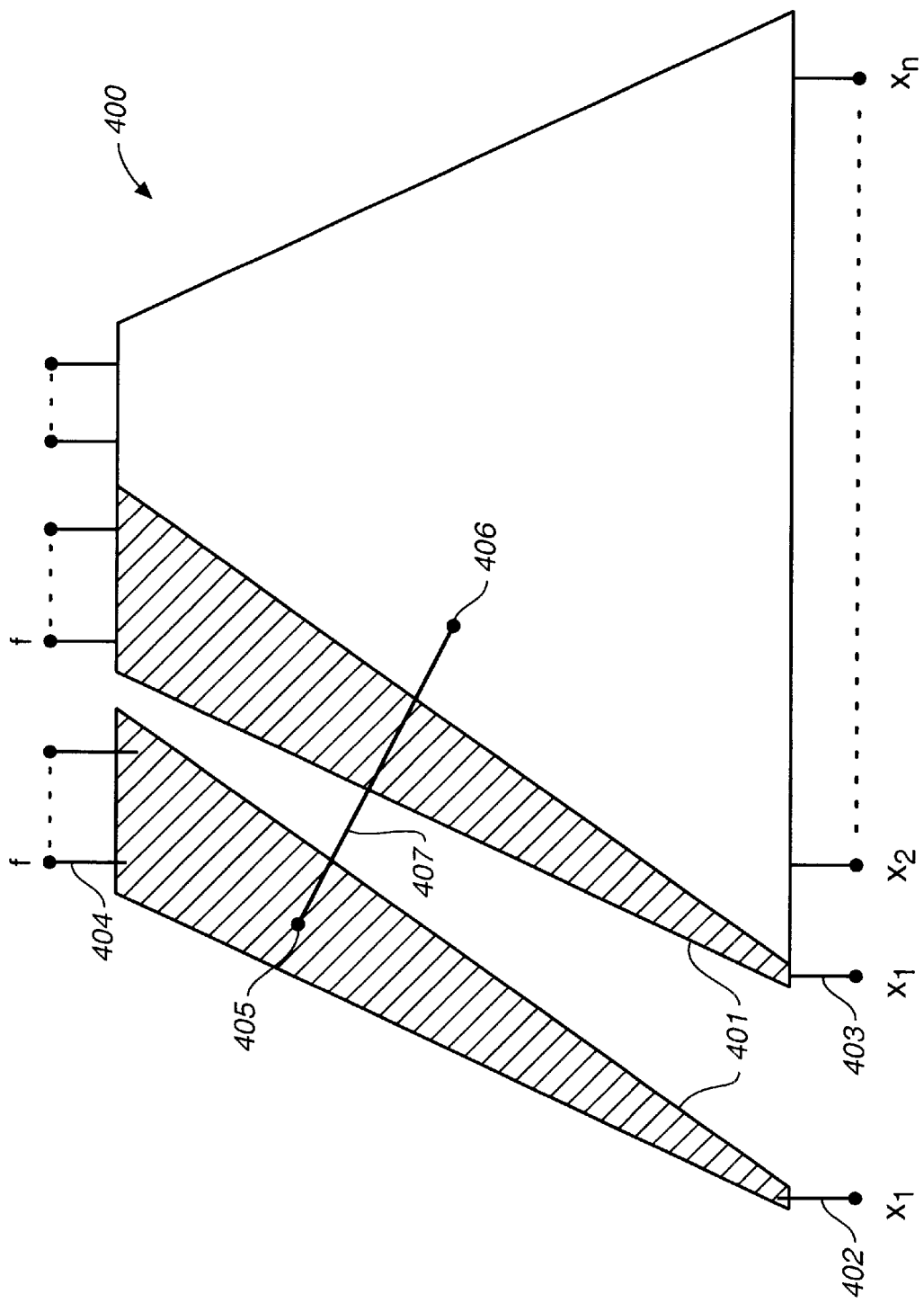
FIG._13

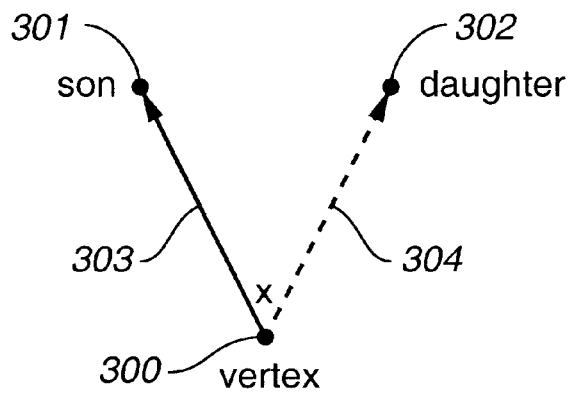
FIG._14
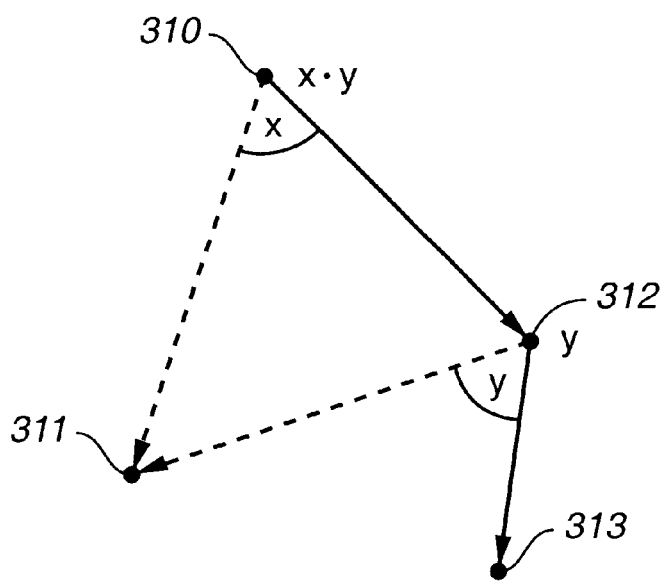
FIG._15

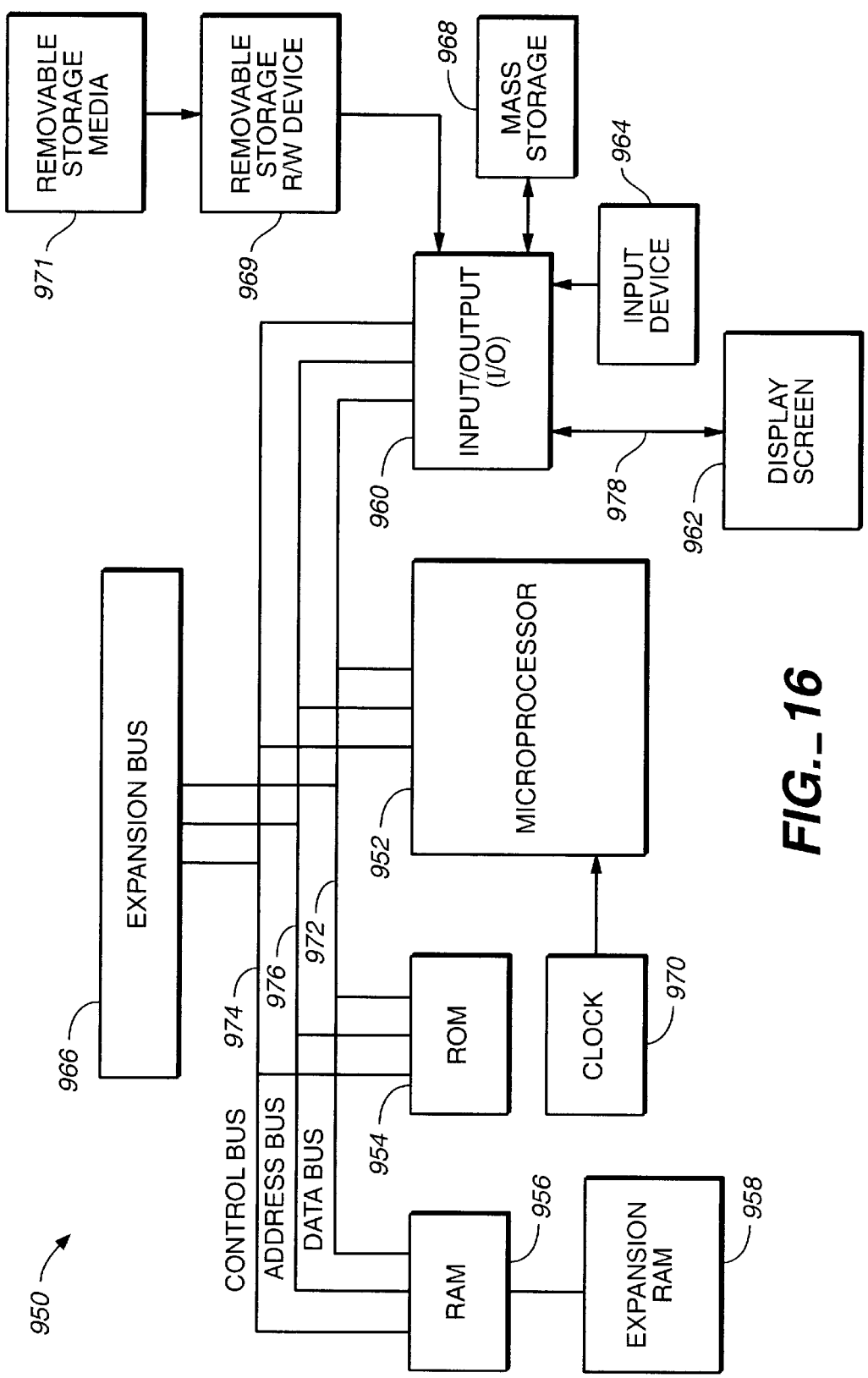
FIG._16

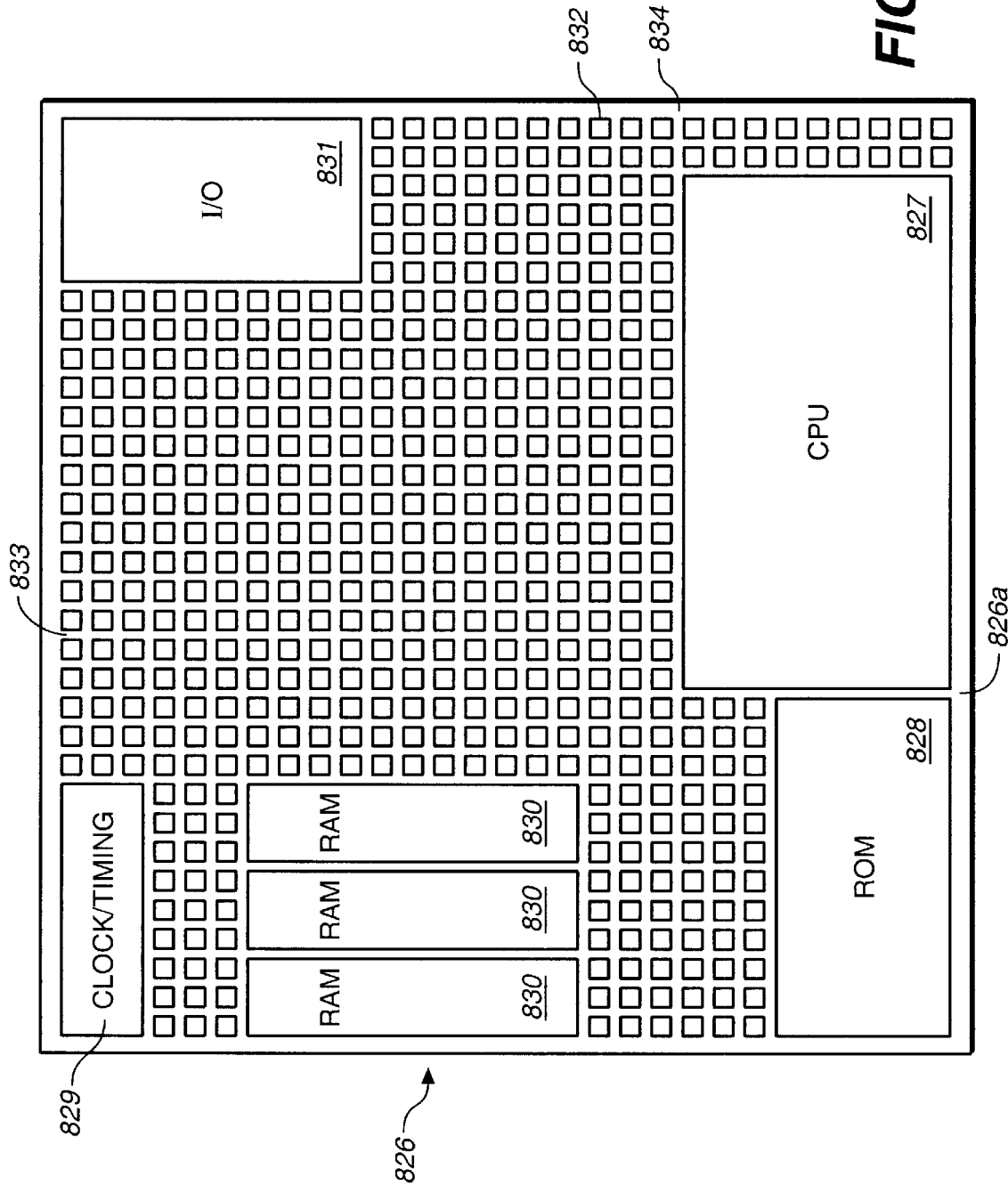
FIG._17

METHOD AND APPARATUS FOR DETECTING EQUIVALENT AND ANTI-EQUIVALENT PINS

BACKGROUND OF THE INVENTION

1. Field of the Invention

This invention relates to a method of analyzing and optimizing design of integrated circuit (IC) designs. In particular, the present invention relates to a method of detecting equivalent and anti-equivalent pins.

2. Description of the Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins.

SUMMARY OF THE INVENTION

The present invention comprises a method for determining equivalent and anti-equivalent pins in a combinational circuit. A portion of a combinational circuit that includes an input of the combinational circuit, and cells that are descendants of the input, is determined. The circuit portion, including the input, and the edges of cells of the portion are duplicated. The original input is set to 1 or 0 and the duplicate input is set to the opposite. A binary decision diagram based on the portion and its duplicate is built, and then reduced.

An inverted reduced binary diagram is then formed by inverting the reduced binary decision diagram and a combined binary decision diagram is constructed by pasting the inverted reduced binary decision diagram to the original reduced binary decision diagram. This combined binary decision diagram is then reduced and equality components are located therein.

BRIEF DESCRIPTION OF THE DRAWINGS

FIG. 1A depicts the schematic symbol for an AND gate;

FIG. 1B depicts the schematic symbol for a NAND gate;

FIG. 1C depicts the schematic symbol for an OR gate;

FIG. 1D depicts the schematic symbol for a NOR gate;

FIG. 1E depicts the schematic symbol for an inverter;

FIG. 2 depicts an AND-OR-INVERT gate;

FIG. 3A depicts the schematic symbol for an XOR gate;

FIG. 3B depicts the mechanization of the XOR gate;

FIG. 4 provides a depiction of a combinational circuit S;

FIG. 5 provides an illustration of a cell within a combinational circuit S;

FIG. 6A illustrates a BDD 320 for the function $x \oplus y$;

FIG. 6B illustrates its variant 321 with negative edges;

FIG. 7 is a flow chart that illustrates the basic steps of the method and apparatus for BDD-based detection of equivalent and anti-equivalent pins in combinational circuits;

FIG. 8 provides an illustration of such a representation of a combinational circuit;

FIG. 9 provides an indication of the circuit from FIG. 8 of the pins to follow during expansion;

FIG. 10 illustrates the building of the fragment Z, its cleaning and references maintenance;

FIG. 11A provides a depiction of a circuit S;

FIG. 11B provides a depiction of a transformed equivalent circuit S';

FIG. 12A shows the underlying graph representing a combinational circuit 99;

FIG. 12B shows the pins of circuit 99 in their assigned levels;

FIG. 13 provides an illustration of the circuit S' 400 that includes the Z fragment 401;

FIG. 14 illustrates a vertex 300 with a son 301 and daughter 302;

FIG. 15 illustrates a BDD that realizes the function x·y;

FIG. 16 is an illustration of a general purpose computer system; and

FIG. 17 depicts an exemplary integrated circuit chip.

DESCRIPTION OF THE PREFERRED EMBODIMENTS

A. Logic Gates and Applicable Boolean Algebra

The binary 0 and 1 states are naturally related to true and false logic variables. Accordingly, Boolean algebra is very useful in the design of electronic logic circuits. A useful way of displaying the results of a Boolean operation is with a truth table.

Electronic circuits that combine digital signals according to Boolean algebra are referred to as "logic gates." Commonly used logic circuits are grouped into families. Such families include, for example, resistor-transistor logic (RTL), diode-transistor logic (DTL), transistor-transistor logic (TTL), N-channel metal-oxide silicon (NMOS), complementary metal-oxide silicon (CMOS) and emitter-coupled logic (ECL). Each family has is advantages and disadvantages. ECL is very fast, for example. MOS features very low power consumption and is therefore often used in VLSI technology.

The schematic symbols of basic logic gates and their associated truth tables are shown in FIGS. 1A to 1E. FIG. 1A depicts the schematic symbol for an AND gate 10. The AND gate 10 has inputs A and B and an output Q. The boolean notation is such that Q=A·B. An AND gate operates in accordance with the following truth table (Table 1A).

Note that A·0=0; A·1=A; A·A=A; and A·$\overline{A}$=0.

TABLE 1A

| A | B | Q |
|---|---|---|
| 0 | 0 | 0 |
| 0 | 1 | 0 |
| 1 | 0 | 0 |
| 1 | 1 | 1 |

FIG. 1B depicts the schematic symbol for a NAND gate 11. The NAND gate 11 has two inputs A and B and an output Q. In accordance with standard Boolean notation, $Q=\overline{A \cdot B}$. A NAND gate operates in accordance with the following truth table (Table 1B).

TABLE 1B

| A | B | Q |
|---|---|---|
| 0 | 0 | 1 |
| 0 | 0 | 1 |
| 1 | 0 | 1 |
| 1 | 1 | 0 |

FIG. 1C depicts the schematic symbol for an OR gate 12. The OR gate 13 has inputs A and B and an output Q. An OR gate operates in accordance with the following truth table (Table 1C). In standard Boolean notation, $Q=A+B$. Note that $A+0=A$; $A+1=1$; $A+A=A$; and $A+\overline{A}=1$.

TABLE 1C

| A | B | Q |
|---|---|---|
| 0 | 0 | 0 |
| 0 | 1 | 1 |
| 1 | 0 | 1 |
| 1 | 1 | 1 |

FIG. 1D depicts the schematic symbol for a NOR gate 13. The NOR gate 13 has inputs A and B and an output Q. In standard Boolean notation, $Q=\overline{A+B}$. A NOR gate operates in accordance with the following truth table (Table 1D).

TABLE 1D

| A | B | Q |
|---|---|---|
| 0 | 0 | 1 |
| 0 | 1 | 0 |
| 1 | 0 | 0 |
| 1 | 1 | 0 |

FIG. 1E depicts the schematic symbol for an inverter 14. The NOT gate 14 has an input A and an output Q. In standard Boolean notation, $Q=\overline{A}$. The open circle is used to indicate the NOT or negation function and can be replaced by an inverter in any circuit. A signal is negated if it passes through the circle. The NOT gate operates in accordance with the following truth table (Table 1E).

TABLE 1E

| A | Q |
|---|---|
| 0 | 1 |
| 1 | 0 |

Boolean operations also obey the usual commutative, distributive and associative rules of normal algebra, as shown by the following Table 2.

TABLE 2

| | | |
|---|---|---|
| $\overline{\overline{A}}$ | = | A |
| $A \cdot B$ | = | $B \cdot A$ |
| $A + B$ | = | $B + A$ |
| $A \cdot (B + C)$ | = | $A \cdot B + A \cdot C$ |
| $A \cdot (B \cdot C)$ | = | $(A \cdot B) \cdot C$ |
| $A + (B + C)$ | = | $(A + B) + C$ |
| $A + A \cdot B$ | = | A |
| $A \cdot (A + B)$ | = | A |
| $A \cdot (\overline{A} + B)$ | = | $A \cdot B$ |
| $A + \overline{A} \cdot B$ | = | $A + B$ |
| $\overline{A} + A \cdot B$ | = | $\overline{A} + B$ |
| $\overline{A} + A \cdot \overline{B}$ | = | $\overline{A} + \overline{B}$ |

In addition, use can be made of De Morgan's theorems, as shown below in Table 3.

TABLE 3

| | | |
|---|---|---|
| $\overline{A \cdot B}$ | = | $\overline{A} + \overline{B}$ |
| $\overline{A + B}$ | = | $\overline{A} \cdot \overline{B}$ |

B. Combinational Logic

Useful and complex circuits can be designed using the basic logic gates discussed above as building blocks. An example of a combinational circuit comprising basic gates is an AND-OR-INVERT gate. FIG. 2 depicts such a gate 20. The AND-OR-INVERT gate 20, which has four inputs A, B, C, and D. It operates in accordance with the following Boolean expressions:

$$Q=\overline{A \cdot B+C \cdot D}$$

$$\overline{Q}=A \cdot B+C \cdot D$$

The exclusive-OR gate (EOR or XOR) is a very useful two-input gate. The schematic symbol of the XOR gate 25 is depicted on FIG. 3A and the XOR gate operates in accordance with the truth table below (Table 3A). From the truth table, the mechanization of the exclusive-OR gate can be derived. The mechanization of the XOR gate is depicted in FIG. 3B. The mechanization of the XOR gate is implemented with two NOT gates (26 and 27), two AND gates (28 and 29) and an OR gate (30).

TABLE 3A

| A | B | Q |
|---|---|---|
| 0 | 0 | 0 |
| 1 | 0 | 1 |
| 0 | 1 | 1 |
| 1 | 1 | 0 |

FIG. 4 provides a depiction of a combinational circuit S 40. The circuit S comprises primary inputs $x_1, x_2, \ldots, x_{n-1}$, and $x_n$. The combinational circuit S also has primary outputs $f_1, f_2, \ldots, f_{k-1}$, and $f_k$. The combinational circuit S depicted in FIG. 4 comprises logic gates and cells.

In accordance with FIG. 4, let S be a combinational circuit with input variables $x_1, \ldots, x_n$ such that $f_c[p](x_1, \ldots, x_n)$ is a Boolean function that characterizes the output of pin p of the logical cell c in S.

FIG. 5 provides an illustration of such a cell 46 within combinational circuit S 40. The cell has inputs 45 and an output to pin 47. Pin 47 provides inputs 48 to other cells within combinational circuit S 40.

Determining the existence of equivalent and anti-equivalent pins is important in connection with the design of combinational circuits, in particular in the context of the optimizing circuit design. Knowledge of equivalent and anti-equivalent pins in a circuit allows circuit designers to reduce the overall footprint of the circuit as well as reduce timing delays in the circuit.

C. Method and Apparatus for the Detection of Equivalent and Anti-Equivalent Pins Described herein is a method and apparatus for BDD-based detection of equivalent and anti-equivalent pins in combinational circuits. Two output pins are "equivalent" if the functions realized on the pins are the same. Conversely, two output pins are "anti-equivalent" if the functions realized on the pins are inverse to each other.

The method described herein uses the notion of an ordered binary decision diagram (hereinafter BDD). Ordered BDD can be categorized based on the following properties:

- acyclic-oriented graph with two terminal vertices (with zero outgoing degree) that correspond to two constants, 0 and 1;
- with k root vertices (with zero ingoing degree) that correspond to Boolean functions $f_1, f_2, \ldots f_k$;
- for every nonterminal vertex is assigned a variable $x_i$; from the list of Boolean variables $(x_1, x_2, x_n)$;
- every nonterminal vertex has two children, a son and a daughter. The son corresponds to the transition x=1, while the daughter corresponds to the transition x=0 (here x is a variable assigned to the vertex). We plot the edge between the vertex and its son with a continuous line while between the vertex and its daughter, we plot the edge with a dotted line. FIG. 14 illustrates a vertex 300 with a son 301 and daughter 302. As seen in FIG. 14, the edge 303 from the vertex to the son is a solid, continuous line and the edge 304 from the vertex to the daughter is a dashed line.
- on any path that goes from the root to the terminal vertex the order of passed variables is the same, for example, $x_1, x_2, \ldots, x_n$ (although some variables might be missed on some path).

The root vertex realizes a function $f(x_1, x_2, \ldots, x_n)$ in the following way. Let $x_1=a_1, x_2=a_2, \ldots, x_n=a_n$ be an assignment of variables. Moving from root vertex f toward terminal vertices, we pass by terminal vertices as though they were traffic signals, e.g. if x=0 then we go to the vertex-daughter and if x=1, we go to the vertex-son.

We let f(a)=b, where a=$(a_1, \ldots a_n)$ b is the constant we reached. FIG. 15 illustrates a BDD that realizes the function x·y. As shown in FIG. 15, from vertex 310, if x=0, the path extends to vertex 311. If x=1, the path extends to vertex 312. From vertex 312, if y=0, the path extends to vertex 311. If y=1, the path extends to vertex 313.

BDD is called a reduced BDD it two additional properties are fulfilled:
i) there is no vertex for which son (z)=daughter (z);
ii) for every two vertices z and n, if son (z)=son (n) and daughter (z)=daughter (n), then u=z.

It is well-known that reduced ordered BDD B for a Boolean function f (B realizes f) appears to be a canonical representation for it (like truth table, canonical sum-of-products, canonical polynomial form), that is for a fixed order of variables, two Boolean functions $f_1$ and $f_2$ are equal if two corresponding BDD's $B_1$ and $B_2$ are isomorphic:

$$f_1 = f_2 \iff B_1 = B_2$$

($B_1$ and $B_2$ are $_n$ reduced and ordered BDD's for $f_1$ and $f_2$ consequently. Two BDD's are isomorphic if they can be "coincided" with each other.).

In order to avoid unnecessary duplication of BDD (when building BDD for negations of the functions), it might be convenient to make use of BDD with negative edges. A negative edge (we mark it by crossing) indicates that the function rooted at the vertex that the edge points to be complemented. Note that we reduce ordered BDD with negative edges quite similarly and that they appear also to be canonical representation for Boolean functions. FIG. 6A illustrates a BDD 320 for the function x⊕y and FIG. 6B illustrates its variant 321 with negative edges.

Let S be a combinational circuit with primary inputs $x_1, \ldots, x_n$, and with k primary outputs. (See FIG. 4). Let p be an output pin of logical cell v of the circuit S or a primary input of this circuit. Denote by $f[p](x_1, \ldots, x_n)$ a Boolean function which realizes on the output pin p of the cell v (on primary inputs of the circuit realized identical functions).

Two pins $p_1$, and $p_2$ are equivalent if $$f[p_1](x_1, \ldots, x_n) = f[p_2](x_1, \ldots, x_n)$$

The two pins are anti-equivalent if $$f[p_1](x_1, \ldots, x_n) = \overline{f[p_2](x_1, \ldots, x_n)}.$$

Let P denote an arbitrary subset of output pins of cells from the circuit S. The problem presented is to build a partition of the set P into classes of equivalent and anti-equivalent pins.

The stated problem often arises in VLSI design with respect to the verification of combinational circuits and the optimization of the design of combinational circuits.

FIG. 7 sets forth a flow chart 200 that illustrates the basic steps of the method and apparatus for BDD-based detection of equivalent and anti-equivalent pins in combinational circuits.

1. Transformation of Combinational Circuit

As a first basic step, given a combinational circuit S, the circuit S is transformed into an equivalent circuit S' such that circuit S' consists only of NOT, AND and XOR gates. In other words, cells in S are substituted with small circuits consisting only of NOT, AND and XOR gates that realize the same functions.

An example of such a transformation is illustrated in FIGS. 11A and 11B, which depict a circuit S and its transformed equivalent circuit S', respectively. As shown in FIG. 11A, circuit S 250 has two primary inputs, pins 251 and 252, as well as output pins 252, 253, 254 and 255. Each pins is associated with inputs or gates as shown below in Table 11A.

TABLE 11A

| Pin | Function |
| --- | --- |
| 251 | primary input $x_1$ |
| 252 | primary input $x_2$ |
| 253 | OR |
| 254 | AND |
| 255 | XOR |
| 256 | OR |

The equivalent circuit S' that results as a consequence of the transformation of circuit S is illustrated in FIG. 11B. As can be seen in FIG. 11B, the transformation process adds several new pins (260–265). The pins of the equivalent circuit S' and their respective functions are shown in Table 11B below.

TABLE 11B

| Pins | Functions |
|------|-----------|
| 251 | Primary input $x_1$ |
| 252 | Primary input $x_2$ |
| 253 | AND |
| 254 | AND |
| 255 | XOR |
| 256 | AND |
| 260 | NOT |
| 261 | NOT |
| 262 | NOT |
| 263 | NOT |
| 264 | NOT |
| 265 | NOT |

2. Topological Ordering of Cells

As a next step, a topological ordering is made of all cells in the equivalent circuit S'. In the preferred embodiment, the zero level consists from all the primary inputs of the equivalent circuit S'. We assign consequently the remaining cells to levels j, where j=1, 2, . . . j represents the length the maximal oriented path goes from inputs of the circuit (0 level) to the given cell.

FIG. 12A shows the underlying graph representing a combinational circuit 99. The combinational circuit 99 has two primary input pins (100 and 103). Pin 100 provides an input 120 to pin 105, an input 121 to pin 106, and an input 122 to pin 101. Pin 103 provides an input 123 to pin 102 and an input 124 to pin 104.

As shown in FIG. 12A, pin 101 provides an input 132 to pin 104 and pin 102 provides an input 125 into pin 105. Pin 105 provides an input 126 into pin 107 and pin 104 provides an input 128 into pin 106 and provides an input 127 into pin 107. Pin 107 provides an input 130 into pin 108, which in turn provides an input 131 into pin 109. Finally, pin 106 provides an input 129 into pin 109.

According to the preferred embodiment of the present invention, pins 100 and 103, because they are primary inputs of the combinational circuit 99, are assigned to level 0. Inputs 120, 121, 122, 123, 124 are then identified as coming from pins in level 0. Each pin that receives one of these inputs is considered for inclusion in level 1. However, only pins 101 and 102 are assigned to level 1. Pin 105 is not included in level 1 because it also accepts input 125. Similarly, pin 104 is not included in level 1 because it also accepts input 125 and pin 106 is not included in level 1 because it also accepts input 128.

In the next step, the system identifies inputs 132 and 125 as coming from pins in level 1. Pin 104 and pin 105 are then included in level 2, because each only accepts inputs coming from level 1 or lower.

In the next step, the system identifies inputs 126, 127 and 128 as coming from pins in level 2. Pins 107 and 106 are then included in level 3 because they receive inputs only from pins in level 2 and lower.

In the next step, inputs 130 and 129 are identified as coming from pins in level 3. Accordingly, pin 108 is assigned to level 4. Pin 109 is not assigned to level 4 because it accepts input 131, which is not from a pin in level 3 or lower.

In the next step, input 131 is identified as coming from a pin in level 4. According to the method, pin 109 is assigned to level 5. FIG. 12B shows the pins of circuit 99 in their assigned levels.

3. Fragmentation of Circuit

After the transformation of the circuit S, each of the cells of the equivalent circuit S' has only one output pin. From the equivalent circuit S', an ordered Binary Decision Diagram ("BDD") is constructed for the function of the form f[v] $(x_1, \ldots, x_n)$, where v∈p, starting from the Shannon expansion of the function around variable $x_1$ is given by:

$$f[v](x_1, \ldots, x_n) = x_1 f[v](1, x_2, \ldots, x_n) + \bar{x}_1 f[v](0, x_2, \ldots, x_n).$$

P is a set of the pins in the equivalent circuit S' that are to be examined for equivalent and anti-equivalent pins. P can include all of the pins in circuit S' or a portion thereof.

We determine in the circuit a "cone" of the cells that depends on the variable $x_1$, duplicate the cone and paste it to the circuit. In other words, all of the cells from the cone are copied together with all their edges.

Denote as the Z fragment the cone and its copy. There are two primary inputs of the Z fragment and both correspond to the variable $x_1$. For some edges of Z, only one end belongs to Z while the other end resides within the remaining portion of the circuit S'. The cells from Z inherit the level numbers that were assigned during the topological ordering process applied to the circuit S'.

FIG. 13 provides an illustration of the circuit S' 400 that includes the Z fragment 401. For purposes of better illustration, the Z fragment 401 is shaded. Each cone of the Z fragment has an x, input (402 and 403). The primary outputs 404 of the circuit S' are also shown. Note that a cell 405 of the duplicate portion of the Z fragment 401 shares an edge 407 with a cell 406 located in the remaining portion of the circuit S'. We then substitute in the Z fragment a constant 1 in primary input $x_1$ and a constant 0 in other primary input $x_1$.

During the operation of the process for determining equivalent and anti-equivalent pins, we constantly rebuild the circuit by removing its cells and edges and also by changing edge's connections. For this purposes it is convenient to introduce references. A reference of a cell v we denote by s[v] and its value in fact just points to the new end of the edge connected with v. More precisely, if s[v]=u, then instead of the cell v we use the cell u and in the case s[v]=−u, then we us its negation. Cell v with s[v]=v is called a regular cell, in contrast with those for which s[v]≠v, which cells will be removed from the circuit during the next cleaning procedure.

The basic process works with circuits and subcircuits and is performed over all levels. For a circuit, its level with number m is a set of all the circuit's cells with the maximal distance from primary. inputs of the circuit equal to m, where m=1,2, . . . Note that parents of any circuit cell are located in circuit levels with smaller numbers than the level number of the cell itself.

4. Cleaning Procedure

As the next step in the preferred embodiment, a cleaning procedure is followed for the fragment Z. In the cleaning procedure, which proceeds level by level, functions are simplified with constants and transformations based on Boolean algebra rules. Since $x_1$ is a constant (either a 1 or 0 depending on the cone), many functions generally can be simplified during this procedure. In addition, unnecessary cells, redundant cells and hung up cells (i.e. without primary outputs) can be eliminated during this procedure.

As a first step in the cleaning process, the cells of the circuit S' are enumerated as follows:

constants 0 and 1 are enumerated with the numbers 0 and 1, respectively.

thereafter, starting with the number 2, primary inputs of the circuit are enumerated and then all the rest cells in topological order.

For cell v we denote by $in_1(v)$ and $in_2(v)$ the numbers of its parents and assume them to be ordered so that $in_1(v) \leq in_2(v)$. We introduce negative edges to the circuit instead of cells of the type NOT (i.e., $in_1(v)$ and $in_2(v)$ will be negative if there is an inverter associated with the corresponding edge) in the circuit. Therefore, all cells of the type NOT are translated in the circuit to the minus sign by the parent's numbers. Now, transformed circuit S' is a circuit (with negative edges) over basis of only two cell types, AND and XOR.

FIG. 8 provides an illustration of such a representation 350 of a combinational circuit. The pins in the representation of the combinational circuit 350 are enumerated 2 to 7. In the representation 350, we denote for convenience negative edges by crossing them. Table 17 below sets forth the parent numbers for each of the pins in the circuit.

TABLE 17

| | | | |
|---|---|---|---|
| $in_1(4) = 2$ | $in_1(5) = 2$ | $in_1(6) = -2$ | $in_1(7) = -4$ |
| $in_2(4) = 3$ | $in_2(5) = 3$ | $in_2(6) = -3$ | $in_2(7) = -5$ |

Let P={4,5,9,11} be a pins from the original circuit that we are going to investigate in order to find equivalent or anti-equivalent pins. We enumerate these pins (or functions) as follows 4→2,5→3,9→4,11→5 (we left numbers 0 and 1 for the constants 0 and 1). We also designate negation of these functions by $\overline{2}, \overline{3}, \overline{4}$ and $\overline{5}$.

In FIG. 9, we indicate in the circuit 350 the pins (we mark them by placing next to them the functions labels in numbers) we are going to follow during expansions.

In the preferred embodiment, the cleaning procedure is carried out over levels of the circuit (or its fragment) and spread from its primary inputs up to its primary outputs. During the cleaning procedure we change references of cells so that:

the parents of any regular cells will be also regular ones;
we make local identity transformations in the cell's neighborhood;
we remove all hanged (disconnected) parts of the circuit; and
we update level numbering of regular cells.

In the preferred embodiment, local identity transformations include the following Boolean transformations: $\overline{0}=1$; $\overline{1}=0$; $0 \cdot f[v]=0$; $1 \cdot f[v]=f[v]$; $0 \oplus f[v]=f[v]$; $1 \oplus f[v]=\overline{f[v]}$; $f[v] \cdot f[v]=f[v]$; $f[v] \cdot \overline{f[v]}=0$; $f[v] \oplus f[v]=0$; $f[v] \oplus \overline{f[v]}=1$; and $\overline{\overline{f[v]}}=f[v]$.

We can illustrate the application of these rules with small examples. Let, for example, for the cell v=20 we have $in_1(v)=-10; s[10]=-5; in_2(v)=12; s[12]=5$.

Then we get for the corresponding functions $f[20]=\overline{f[5]} \oplus f[5]=0$.

Thus, s[20]=0. In another situation, let the same cell v=20 have $in_1(v)=-10; s[10]=-5; in_2(v)=12; s[12]=-7$.

Then we get s[20]=20, $in_1(v)=in_2(v)=7$ and we have to change level number of the cell v making it equal to l+1 where l is maximum from two level numbers of cells 5 and 7.

5. Operation of the Syntactic Simplifier

The operation of the syntactic simplifier is accomplished in the circuit level by level. In general, working with cells from a level, we sort them, and paste together the cells from the same component of equality. For sorting purposes, we assign to each cell a vector consisting of a bit string and the parents' numbers, as is discussed more fully below.

First, in the preferred embodiment, we compute (moving from level to level) the value sim[v] for every cell v of the current circuit (or its fragment) when simulating on 32 (or 64) random input bit strings. It is worth noting that, in computer implementations, this can be done (moving from level to level) simultaneously for all input strings. We denote (the lowest) r bit values of sim[v] by $sim_r[v]$, where $r \leq 25$ is a parameter that we choose in accordance with the number of cells in the level. We invert the bit string sim[v] and take the first r bit as well and denote this by $\overline{sim_r[v]}$. From these two numbers $sim_r[v]$ and $\overline{sim_r[v]}$ (both are less than $2^r$), we choose the least one (with the r-th bit 0) and denote it by $monsirm_r[v]$. Note that this value will be the same both for the function f[v] and its complement $\overline{f[v]}$ for all v.

The additional action taken with respect to cells will differ slightly depending on the type of cell (i.e., whether it is an AND or XOR gate). To all cells v of the type AND from a current level we associate the vector $(sim_r[v], in_1(v), in_2(v))$. Let K be a component. It is not difficult to see that all cells from K are copies of each other and thus all but one can be removed. We left in the circuit first cell v from K and for the all the rest of the cells u from K we change its reference, s[u]=v. So we do for all nontrivial components we find.

To the cells of the current level of the type XOR we associate the modified vector $(monsim_r[v], |in_1(v)|, |in_1(v)|)$. In this case, in all cell from the same component are implemented either equal functions or the complement of each other. We are left again with the first cell in each component v and for the all rest cells u from K we first find out what from two alternatives takes place (by comparing number of negative edges by v and u) and then we change reference, by putting s[u]=v or s[u]=-v.

After finishing this process of component processing we launch the cleaning procedure starting from the next level. Note that when cleaning of upper levels some cells can "fall down" to the lower levels and moreover to the levels that was already processed by the syntactic simplifier. This possibly missed pasting together of such cells will be detected and processed by the syntactic simplifier during its next run.

6. Semantic Simplifier

When the number of variables t on which the current circuit is dependent is small, namely $t \leq 6$, we make full simulating of the current circuit $S_{n-t}$ by computing for all cells v its value totalsim[v] for the output function f[v] on all $2^1$ input bit strings. If t=6, we divide this bit vector into 3 parts and if t=5, then we divide it into 2 parts, and after that we carry out vector procedure of finding nontrivial components. If $t \leq 4$ we sort all values totalsim[v] directly. We proceed components as before as in the case of cells of the type AND, that is in each component we left in the circuit first cell v from the component and for all the rest cells u from the component we make reference to the cell y, s[u]=v. It is natural, that as for the first cell from the component, we choose cells from more lower levels.

7. Building of Fragment Z

Let SS be a subcircuit. We denote by $Con_{up}$ (SS), the upper cone of cells generating by cells from SS, i.e. a set of cells from SS together with all their successors in the circuit. We define the low cone $Con_{low}$(SS) in the same way as a set of all cells SS with all their predecessors.

For given subcircuit SS, these cones can be easily constructed. For example, to build $Con_{up}$(SS), we label all cells from SS with label 1 and all other cells of the subcircuit with label 0. By looking over all cells level by level we change the label of the current cell from 0 to 1 if at least one of its parents is labeled with 1. As a result of this process, we obtain the required set $Con_{up}(SS)$ as the set of all cells labeled with 1. The set $Con_{low}(SS)$ might be built similarly but this time we proceed in a dual way.

Let now $x_j$ be a current variable in Shannon's expansion. We build in the current circuit the cone $Con_{up}(SS)$, where we put $SS=\{v_j\}$, and level expansion of its cells. We copy all cells from this cone by doubling them together with all their edges. We enumerate new cells from the cone copy and add them to the corresponding levels of the cone. Then we put the reference of the primary input $x_j$ in the cone $Con_{up}(SS)$ is equal to 0 and in its copy we put it equal to 1. This cone $Con_{up}(SS)$, together with its copy and with specified substitution of constants forms a fragment Z of the current circuit under which the main work of the algorithm is carried out during its current step.

FIG. 10 illustrates the building of the fragment Z, its cleaning and references maintenance.

| S[8] = 1 | S[2] = 0 | (S[3] = 3) |
|---|---|---|

After Processing 1 Level:

| S[4] = 0 | S[5] = 3 | S[6] = −3 |
|---|---|---|
| S[9] = 3 | S[10] = −3 | S[11] = 0 |

After Processing 2 Level:

| S[7] = −3 | S[12] = 0 |
|---|---|

We also marked cofactors of the original functions in the fragment Z and a new function 6 in the circuit $S_1$.

8. Choice of Variables

In order to determine which variables under Shannon's expansion of circuits we choose, we determine the consecutive variable by making a preliminary backward search. In other words, for every variable we construct first the corresponding fragment Z, then we perform the cleaning operation (and also possibly apply syntactic simplification). We compute the number of regular cells in it and also compute the number of reduced functions. Based upon obtained values, we make the final decision and choose the optimal variable for which we make real expansion.

9. Building of a Cofactors Transition Graph

In the performance of our process, we observe the performance to determine changes that happen with functions from the given set P and further with their cofactors. Functions during the consecutive expansions over a variable generate cofactors. Besides that, functions and cofactors might reduce to the constants or paste together during cleaning procedure and syntactic or semantic simplifications.

We enumerate functions and their cofactors in the following way. First we enumerate constants 0 and 1, then functions from the set P, and then we enumerate in order all cofactors that appear in the expansion processes. For the current set of cofactors, we have array of references to the cells of the current circuit on output pins of which they are implemented. Besides that, we store an inverse array, which for a given number of the cell, gives us information as to whether this cell implements some cofactor from the set of function being constructed (in such a case we get also the cofactor's number) or not.

We follow for the transition graph of functions and their cofactors with array Bin. Let the number of some function f[v] (or its cofactor) be equal to $n_v$ and corresponding number of its 1-successor $f[v](x_1, \ldots, 1, \ldots x_n)$ and its 0-successor $f[v](x_1, \ldots, 0, \ldots x_n)$ under Shannon's expansion around variable $x_j$ are $n_1$ and $n_0$. Then we write down to the array Bin to the places $Bin[4 \cdot n_v], \ldots, Bin(4 \cdot n_v+3]$ in it the following vector $(n_0, n_1, j, s[n_v])$, where $s[n_v]$ is a reference of the function f[v]. If $s[n_v]=-1$, then it means that function f[v] with the number $n_v$ appear to be regular one, and if, for example, $s[n_v]=n_u$, or $s[n_v]=-n_u$, then it means that the function with number $n_v$ pasted together with the function numbered $n_u$ or with its complement. Note that in last case, the function, numbered $n_v$ is absent in the transition graph though all information about this function is stored in the array Bin.

10. Procedures of Compressing and Swapping

During the process of circuit expansions we use uniform numbering of all cells from circuits and also uniform numbering for all generated cofactors. Although some of numbers become unnecessary, we compute the number of removed or pasted together cells and also the number of removed or pasted together functions and their cofactors and if the fraction in the total amount exceeds some preset threshold, then we renumber fully during which all regular cells (regular functions) will be numbered in a row.

If the maximal cell numbers (function numbers) in any event approach some preset limit, then together with described above compression procedure, we make reallocation of all memory used by the algorithm. These procedures carry out independently for circuit and for transition graph.

11. Reducing of BDD

When the graph of functions (and their cofactors) is completely built, it comprises the required Binary Decision Diagram (BDD), which must now be reduced. Reducing (simplifying) and cleaning of the BDD accomplished in the same general way as it is described above for circuits. It should be noted, however, that we have to find and paste together all possible identifications of BDD nodes without gaps.

During the cleaning of the BDD graph, we apply the following rule—if for the function f its 0-successor $f_0$ coincides with its 1-successor $f_1$, i.e. $f_0=f_1$, =g form g, then we paste together f with g by means of reference. As before for the cleaning procedure, we process references and change level numbers. Note that, in this case, nodes of the graph can not "fall down" below the current level and this in fact guarantees completeness of the syntactic simplifier.

During the work of the simplifier, we associate to any regular node of the graph B vector $(j, n_0, n_1)$, that is the number of the variable and numbers of the given node. After that, we find and process level by level equality components quite analogously to the case of circuits. The only difference is in that on appearance (due to cleaning) of new nodes in the current level we include them in the current process of sorting.

On finishing this procedure of BDD reduction, we invert it by interchanging terminal cell 0 and 1 and paste together with the original BDD in the terminal cell. In order to create a uniform numbering, we associate with node v from the original reduced BDD its new number 2v, and with the same node but in the invert BDD now number 2v+1. Note that all odd nodes now correspond to the functions that appear to be complements of the corresponding functions with even numbers.

By applying once more (this time to the combined BDD) the reduction procedure, we get as a result reduced BDD for all functions from the given set P and also for their complements. When fulfilled for functions references procedure of finding equality components, we get the desired partition of given pins into equivalent and anti-equivalent ones.

D. Apparatus for Performing Present Invention

FIG. 16 is an illustration of a general purpose computer system, representing one of many suitable computer platforms for implementing the inventive IC design optimization methods described above. FIG. 16 shows a general purpose computer system 950 in accordance with the present invention includes a central processing unit (CPU) 952, read only memory (ROM) 954, random access memory (RAM) 956, expansion RAM 958, input/output (I/O) circuitry 960, display assembly 962, input device 964, and expansion bus 966. Computer system 950 may also optionally include a mass storage unit 968 such as a disk drive unit or nonvolatile memory such as flash memory and a real-time clock 970.

CPU 952 is coupled to ROM 954 by a data bus 972, control bus 974, and address bus 976. ROM 954 contains the basic operating system for the computer system 950. CPU 952 is also connected to RAM 956 by busses 972, 974, and 976. Expansion RAM 958 is optionally coupled to RAM 956 for use by CPU 952. CPU 952 is also coupled to the I/O circuitry 960 by data bus 972, control bus 974, and address bus 976 to permit data transfers with peripheral devices.

I/O circuitry 960 typically includes a number of latches, registers and direct memory access (DMA) controllers. The purpose of I/O circuitry 960 is to provide an interface between CPU 952 and such peripheral devices as display assembly 962, input device 964, and mass storage 968.

Display assembly 962 of computer system 950 is an output device coupled to I/O circuitry 960 by a data bus 978. Display assembly 962 receives data from I/O circuitry 960 via bus 978 and displays that data on a suitable screen.

The screen for display assembly 962 can be a device that uses a cathode-ray tube (CRT), liquid crystal display (LCD), or the like, of the types commercially available from a variety of manufacturers. Input device 964 can be a keyboard, a mouse, a stylus working in cooperation with a position-sensing display, or the like. The aforementioned input devices are available from a variety of vendors and are well known in the art.

Some type of mass storage 968 is generally considered desirable. However, mass storage 968 can be eliminated by providing a sufficient mount of RAM 956 and expansion RAM 958 to store user application programs and data. In that case, RAMs 956 and 958 can optionally be provided with a backup battery to prevent the loss of data even when computer system 950 is turned off. However, it is generally desirable to have some type of long term mass storage 968 such as a commercially available hard disk drive, nonvolatile memory such as flash memory, battery backed RAM, PC-data cards, or the like.

A removable storage read/write device 969 may be coupled to I/O circuitry 960 to read from and to write to a removable storage media 971. Removable storage media 971 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 950 by typing on a keyboard, manipulating a mouse or trackball, or "writing" on a tablet or on position-sensing screen of display assembly 962. CPU 952 then processes the data under control of an operating system and an application program stored in ROM 954 and/or RAM 956. CPU 952 then typically produces data which is outputted to the display assembly 962 to produce appropriate images on its screen.

Expansion bus 966 is coupled to data bus 972, control bus 974, and address bus 976. Expansion bus 966 provides extra ports to couple devices such as network interface circuits, modems, display switches, microphones, speakers, etc. to CPU 952. Network communication is accomplished through the network interface circuit and an appropriate network.

Suitable computers for use in implementing the present invention may be obtained from various vendors. Various computers, however, may be used depending upon the size and complexity of the optimization tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, DVD, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

E. Fabrication of Optimized ICs

After the initial circuit description is optimized as discussed above, additional steps must be taken to complete the manufacture of the IC. These additional steps are very well known by those skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

An exemplary integrated circuit chip is illustrated in FIG. 17 and generally designated by the reference numeral 826. The circuit 826 includes a semiconductor substrate 826A on which are formed a number of functional circuit blocks that can have different sizes and shapes. Some are relatively large, such as a central processing unit (CPU) 827, a read-only memory (ROM) 828, a clock/timing unit 829, one or more random access memories (RAM) 830 and an input/output (I/O) interface unit 831. These blocks, commonly known as macroblocks, can be considered as modules for use in various circuit designs, and are represented as standard designs in circuit libraries.

The integrated circuit 826 further comprises a large number, which can be tens of thousands, hundreds of thousands or even millions or more of small cells 832. Each cell 832 represents a single logic element, such as a gate, or several logic elements interconnected in a standardized manner to perform a specific function. Cells that consist of two or more interconnected gates or logic elements are also available as standard modules in circuit libraries.

The cells 832 and the other elements of the circuit 826 described above are interconnected or routed in accordance with the logical design of the circuit to provide the desired functionality. Although not visible in the drawing, the various elements of the circuit 826 are interconnected by electrically conductive lines or traces that are routed, for example, through vertical channels 833 and horizontal channels 834 that run between the cells 832.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement. This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing. The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for determining equivalent and anti-equivalent pins in a combinational circuit, said method comprising the following steps:
   a. determining a portion of a combinational circuit such that the portion comprises a first input and cells that are descendants of said first input;
   b. duplicating said portion, including duplicating said first input, and the edges of cells of said portion;
   c. setting one of the first inputs to 1 and the other to 0;
   d. building a binary decision diagram based on said portion and its duplicate;
   e. forming a first reduced binary decision diagram by reducing said binary decision diagram;
   f. forming an inverted reduced binary diagram by inverting the first reduced binary decision diagram;
   g. forming a combined binary decision diagram by pasting the inverted reduced binary decision diagram to the first reduced binary decision diagram;
   h. forming a reduced combined binary decision diagram by reducing the combined binary decision diagram; and
   i. locating equality components within said reduced combined binary decision diagram.

2. The method of claim 1 further comprising the following step:
   j. after step c and before step d, simplifying said portion and its duplicate.

3. The method of claim 1 wherein said portion of the combinational circuit, not including said first input, comprises only AND, NOT and XOR cells.

4. The method of claim 1 further comprising the following step:
   j. prior to step a, transforming an original combinational circuit into the combinational circuit mentioned in step a.

5. The method of claim 2 wherein the wherein step j comprises pasting cells of the same component of equality.

6. A system for determining equivalent and anti-equivalent pins in a combinational circuit, said system comprising the following:
   a. means for determining a portion of a combinational circuit such that the portion comprises a first input and cells that are descendants of said first input;
   b. means for duplicating said portion, including duplicating said first input, and the edges of cells of said portion;
   c. means for setting one of the first inputs to 1 and the other to 0;
   d. means for building a binary decision diagram based on said portion and its duplicate;
   e. means for forming a first reduced binary decision diagram by reducing said binary decision diagram;
   f. means for forming an inverted reduced binary diagram by inverting the first reduced binary decision diagram;
   g. means for forming a combined binary decision diagram by pasting the inverted reduced binary decision diagram to the first reduced binary decision diagram;
   h. means for forming a reduced combined binary decision diagram by reducing the combined binary decision diagram; and
   i. means for locating equality components within said reduced combined binary decision diagram.

7. The system of claim 6 further comprising the following:
   j. means for simplifying said portion and its duplicate.

8. The system of claim 6 wherein said portion of the combinational circuit, not including said first input, comprises only AND, NOT and XOR cells.

9. The system of claim 6 further comprising the following:
   j. means for prior to step a, transforming an original combinational circuit into the combinational circuit mentioned in step a.

10. The system of claim 7 wherein the wherein step j comprises pasting cells of the same component of equality.

11. A computer-readable medium storing computer-executable process steps for determining equivalent and anti-equivalent pins in a combinational circuit, wherein said process steps include steps for:
    a. Determining a portion of a combinational circuit such that the portion comprises a first input and cells that are descendants of said first input;
    b. duplicating said portion, including duplicating said first input, and the edges of cells of said portion;
    c. setting one of the first inputs to 1 and the other to 0;
    d. building a binary decision diagram based on said portion and its duplicate;
    e. forming a first reduced binary decision diagram by reducing said binary decision diagram;
    f. forming an inverted reduced binary diagram by inverting the first reduced binary decision diagram;
    g. forming a combined binary decision diagram by pasting the inverted reduced binary decision diagram to the first reduced binary decision diagram;
    h. forming a reduced combined binary decision diagram by reducing the combined binary decision diagram; and
    i. locating equality components within said reduced combined binary decision diagram.

12. The computer-readable medium of claim 11 further comprising the following step:
    j. after step c and before step d, simplifying said portion and its duplicate.

13. The computer-readable medium of claim 11 wherein said portion of the combinational circuit, not including said first input, comprises only AND, NOT and XOR cells.

14. The computer-readable medium of claim 11 further comprising the following step:
   j. prior to step a, transforming an original combinational circuit into the combinational circuit mentioned in step a.

15. The computer-readable medium of claim 12 wherein the wherein step j comprises pasting cells of the same component of equality.

* * * * *